United States Patent [19]

Sakamoto

[11] Patent Number: 5,295,298
[45] Date of Patent: Mar. 22, 1994

[54] METHOD OF FORMING LEADS OF SEMICONDUCTOR DEVICE TO SHAPE

[75] Inventor: Hideo Sakamoto, Tokyo, Japan

[73] Assignee: NEC Corporation, Tokyo, Japan

[21] Appl. No.: 52,678

[22] Filed: Apr. 27, 1993

[30] Foreign Application Priority Data

Apr. 27, 1992 [JP] Japan .................................. 4-107205

[51] Int. Cl.⁵ ........................................... H01R 43/00
[52] U.S. Cl. ..................................... 29/827; 29/33 M;
29/566; 437/220
[58] Field of Search .............. 29/845, 827, 33 M, 566;
437/220

[56] References Cited

FOREIGN PATENT DOCUMENTS

| 2354116 | 4/1975 | Fed. Rep. of Germany | 29/845 |
| 61-69158 | 4/1986 | Japan | 29/827 |
| 3-22467 | 1/1991 | Japan | 29/827 |
| 3-129863 | 6/1991 | Japan | 29/827 |

*Primary Examiner*—Carl J. Arbes
*Attorney, Agent, or Firm*—Sughrue, Mion, Zinn, Macpeak & Seas

[57] ABSTRACT

A semiconductor device of the SOP type packaged on a lead frame and separated individually is fed into a lead-forming position by a holder, and the distal ends of leads arrayed on one side of the semiconductor device are imaged by a camera. The image data from the camera is processed by a recognition unit, which outputs the actual position of the semiconductor device. If the recognized actual position is different from the position to start forming leads, then a controller actuates the holder to eliminate the positional error and to position the semiconductor accurately in the lead-forming position. Based on data corresponding to the type of the semiconductor device, the lead bases of the leads are held by a lead-fixing finger assembly, and the distal end portions of the leads are bent arcuately by a lead-forming finger assembly, thereby forming the leads to a predetermined shape. Then, the leads on the opposite side of the semiconductor device are similarly formed to shape after the semiconductor device has been turned 180° by the holder. To form the leads arrayed on four sides of a semiconductor device of the QFP type, two arrays of leads are simultaneously formed to shape by lead-forming devices disposed one on each side of the lead-forming position, and then two other arrays of leads are simultaneously formed by the lead-forming assemblies. Therefore, the leads can be formed to shape in two cycles of operation.

7 Claims, 5 Drawing Sheets

METHOD OF FORMING LEADS OF SEMICONDUCTOR DEVICE TO SHAPE

BACKGROUND OF THE INVENTION

1. Field of the Invention

The present invention relates to a method of forming leads of a semiconductor device to a predetermined bent shape, and more particularly to a method of forming leads of a semiconductor device such as of the QFP (Quad Flat Package) or SOP (Small Outline Package) type.

2. Description of the Related Art

FIG. 1 of the accompanying drawings shows a conventional process of forming leads of a semiconductor device. As shown in FIG. 1, semiconductor device 1 packaged on a lead frame is placed in die assembly 10 by a feeder (not shown). Then, press 11 is actuated to close die assembly 10, thereby forming separate leads 12 extending from the lead frame to a predetermined shape. Specifically, when press 11 is actuated, lead holders 9 hold lead bases, or proximal lead ends, against die 8, and then punches 7 press leads 12 downwardly against die 8. Leads 12 are sandwiched between and plastically deformed to the desired shape by punches 7 and die 8. Punches 12 and die 8 are dimensioned to press leads 12 to the final shape when punches 12 are displaced toward die 8.

Conventional die assembly 10 needs to be newly manufactured and the dimensions of the pressing components have to be measured each time semiconductor devices of different package sizes are fabricated. Die assembly 10 is expensive, e.g., it costs 2 million to 4.5 million yen, and it takes a long period of time, e.g., 2 to 4 months for the die manufacturer to supply a new die assembly to the semiconductor manufacturer. The long period of time required to manufacture die assemblies has been a bottleneck in the development of new semiconductor devices.

The recent trend of the semiconductor industry is toward the fabrication of small quantities of semiconductor devices of many different types. Since the number of semiconductor devices per lot s small, e.g., several hundred or less, according to this fabrication practice, the time required to produce one lot of semiconductor devices with one die assembly is short, resulting in frequent die assembly replacement (one replacement process takes about 20 minutes). Accordingly, the availability of the semiconductor fabrication system is lowered, as is the productivity thereof. Another problem of an increased number of die assemblies used is that a large floor space is required to store the die assemblies in the factory, and hence the efficiency of factory floor utilization becomes poor.

When leads 12 are formed by die assembly 10, solder-plated layers are scraped off leads 12 because they are held in abrasive engagement with punches 7 and die 8. The scraped solder particles are attached to leads 12, tending to develop a short circuit when semiconductor device 1 is put to use.

SUMMARY OF THE INVENTION

It is therefore an object of the present invention to provide a method of forming leads of a semiconductor device such as a QFP or SOP with the same lead forming assembly whose mold is not required to be replaced when a different semiconductor device type is fabricated, so that semiconductor devices can be produced at high productivity and the net working rate of the apparatus is high.

According to the present invention, there is provided a method of forming an array of leads of a semiconductor device packaged on a lead frame and separated individually to a predetermined shape, comprising the steps of:

(a) feeding a semiconductor device along a feed path into a lead-forming position;

(b) holding the semiconductor device in said lead-forming position;

(c) recognizing the actual position of distal ends of leads arrayed on one side of the semiconductor device;

(d) correcting the positional error, if any, of said actual position with respect to the position to start forming the leads, thereby accurately positioning the semiconductor device in said lead-forming position;

(e) holding lead bases of the leads with a lead-fixing finger assembly and distal end portions of the leads with a lead-forming finger assembly based on data corresponding to the type of the semiconductor device;

(f) moving the distal end portions of the leads arcuately about the lead bases thereof with the lead-forming finger assembly, thereby bending the leads to shape;

(g) thereafter turning the semiconductor device about the central axis thereof in the lead-forming position to position the distal ends of leads arrayed on another side of the semiconductor device in the position to start forming the leads;

(h) repeating steps (e) and (f) to bend the leads arrayed on the side of the semiconductor device to shape; and (i) repeating steps (g), (e), and (f) until the leads on all sides of the semiconductor device are bent to shape.

In another way to form the leads on all four sides of a semiconductor device of the QFP type, the leads arrayed on one pair of opposite sides thereof are simultaneously formed to shape in the same manner as described above in the lead-forming position. Then the semiconductor device is turned 90°, and the leads on the other pair of opposite sides thereof are similarly formed to shape. Therefore, all the leads can be formed to shape in two successive cycles of operation.

To form the leads on all four sides of a semi-conductor device of the QFP type, two lead-forming devices of a same type are positioned one on each side of the lead-forming position, and the arrays of leads on opposite sides are simultaneously formed to shape by the respective lead-forming devices. Therefore, all the leads can be formed to shape in two successive cycles of operation.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
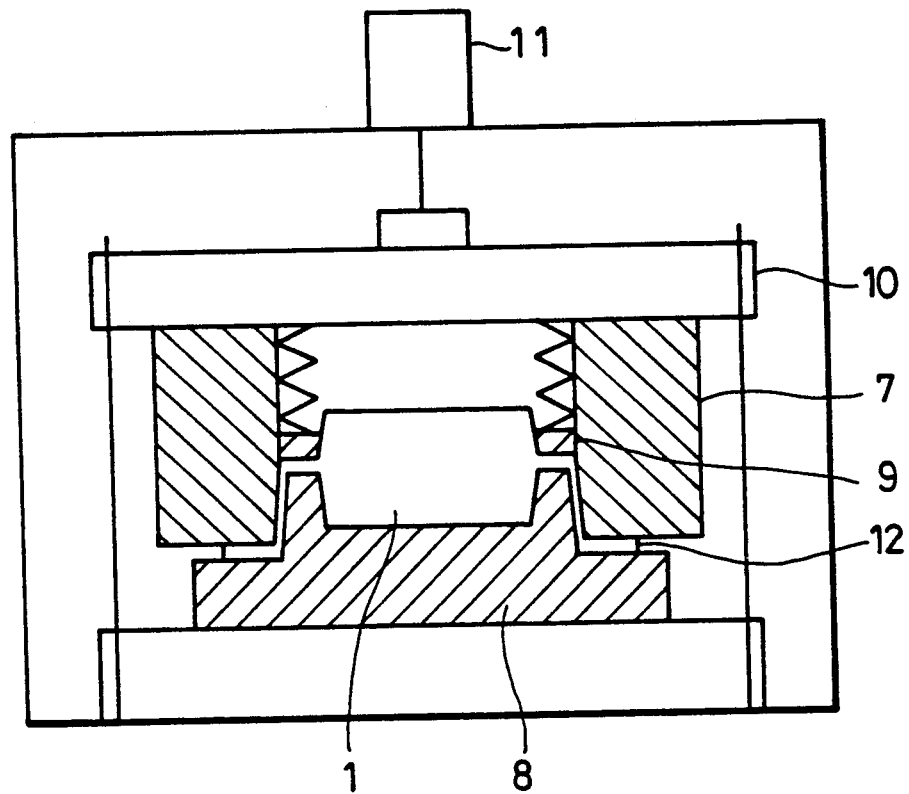
FIG. 1 is a cross-sectional view of a conventional apparatus for forming leads of a semiconductor device.
Figure 2:
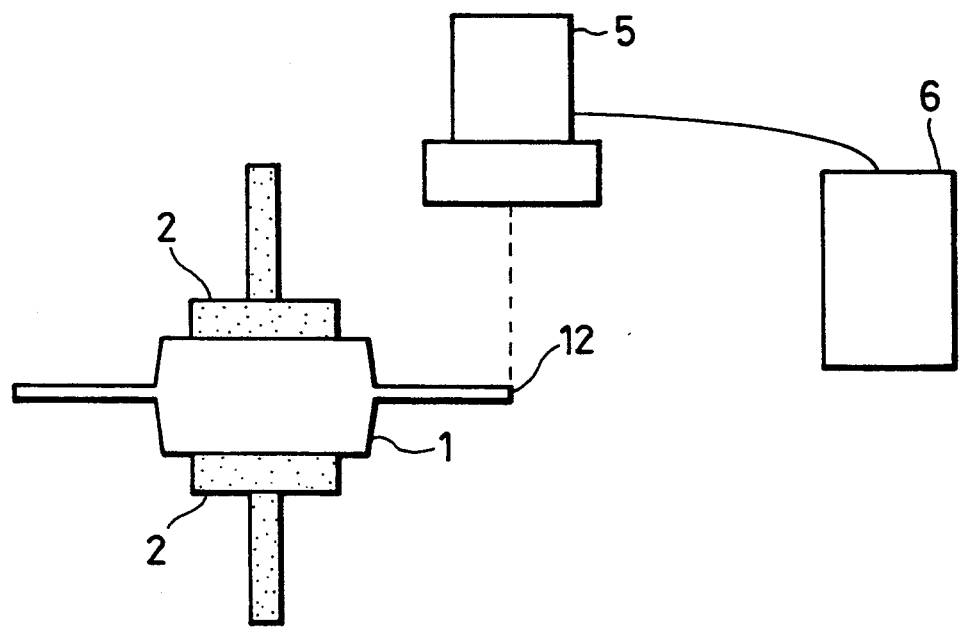
FIG. 2 is a cross-sectional view, partly in block form, showing the manner in which a semiconductor device is positioned by an apparatus according to an embodiment of the present invention.

As shown in FIG. 2, an apparatus for forming leads of a semiconductor device using a method of the present invention has holder 2 comprising a feeding and positioning mechanism for feeding semiconductor device 1 of the SOP type whose arrays of leads 12 are to be formed, which is supplied from a previous process, along a horizontal feed path in the Y direction (normal to the sheet of FIG. 2), and positioning semiconductor device 1 vertically in the Z direction normal to the feed path and horizontally in the X direction normal to the feed path in a lead-forming position where leads 12 of semiconductor device 1 are formed to shape. Holder 2 can be rotated about the vertical central axis passing centrally therethrough by a rotating mechanism (not shown).

The apparatus also has camera 5 such as a television camera for imaging the distal ends of leads 12 of semiconductor device 1 that has been fed to the lead-forming position, and supplying image data to recognition unit 6. Recognition unit 6 processes the supplied image data and outputs corrective data for correcting the position of semiconductor device 1 with respect to the lead-forming position.

Figure 3:
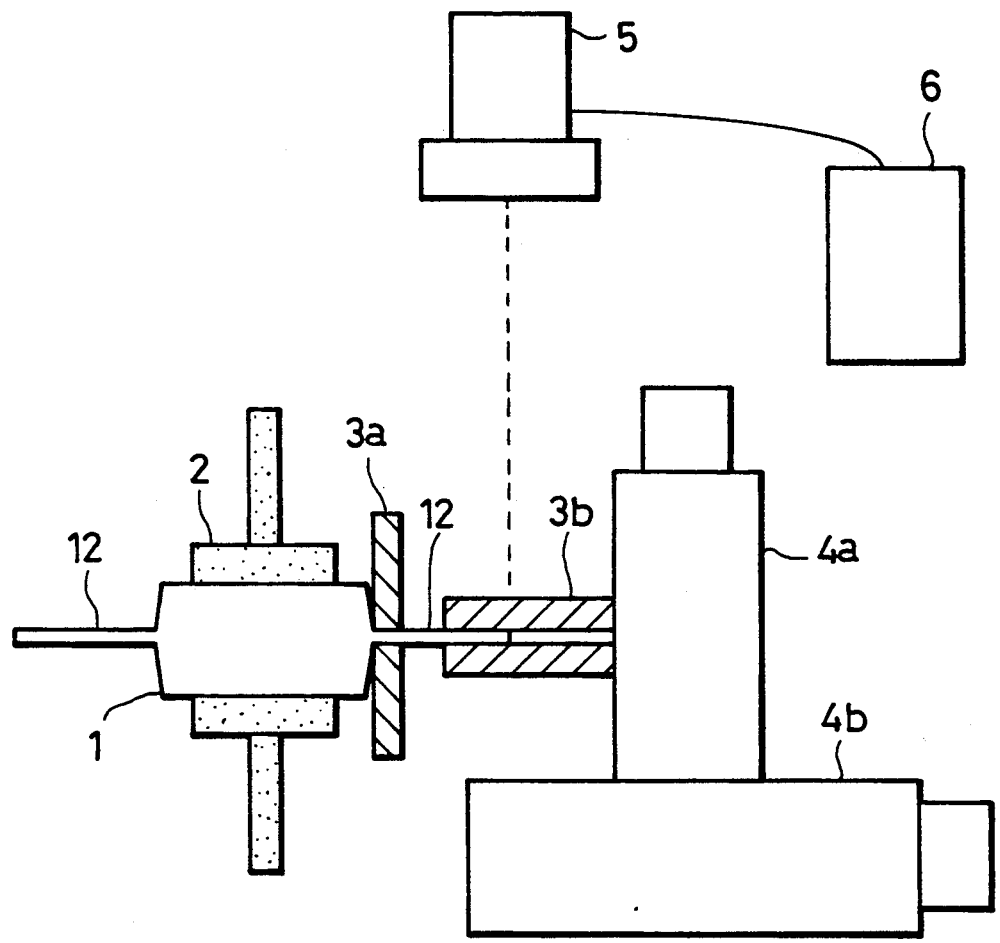
FIG. 3 is a cross sectional view, partly in block form, showing the manner in which leads of a semiconductor device are held by the apparatus at the time the leads start being formed to shape.

As shown in FIG. 3, the apparatus also has lead-fixing finger assembly 3a including a fixed lower finger supported directly on an apparatus frame (not shown) and a movable upper finger supported on the apparatus frame through a spring (not shown), and a mechanism (not shown) for moving the movable upper finger to grip lead bases between the upper and lower fingers when leads 12 are formed to shape. The apparatus further has lead-forming finger assembly 3b including a fixed finger and a movable finger. The movable finger is vertically movable toward and away from the fixed finger. When leads 12 are formed to shape, the movable and fixed fingers of lead-forming finger assembly 3b grip distal ends of the leads 12.

Lead-forming finger assembly 3b is mounted on Z-axis table assembly 4a. Z-axis table assembly 4a comprises a table which supports lead-forming finger assembly 3b and is movable in the Z direction, a support by which the table is movably supported, and an actuator mechanism for driving the table and lead-forming finger assembly 3b. Z-axis table assembly 4a is mounted on X-axis table assembly 4b. X-axis table assembly 4b comprises a table which supports Z-axis table assembly 4a and is movable in the X direction, a support by which the table is movably supported, and an actuator mechanism for driving the table.

The apparatus also has a controller (not shown) which stores registered data. When supplied with corrective data from recognition unit 6, the controller controls holder 2 to position semiconductor device 1 in the lead-forming position. Using registered data corresponding to the type number, supplied from an external source, of semiconductor device 1, the controller also controls the actuator mechanisms of Z-and X-axis table assemblies 4a, 4b to form leads 12 to shape.

A method of forming leads 12 to shape according to the present invention will be described below.

First, semiconductor device 1 with leads 12 to be formed to shape, which is supplied from a previous process, is fed to the lead-forming position along the feed path while semiconductor device 1 is being held aerially. Camera 5 produces image data of the distal ends of leads 12 arrayed on one side of semiconductor device 1 that has been fed to the lead-forming position, and outputs the image data to recognition unit 6. Recognition unit 6 processes the supplied image data to determine the present position of the distal ends of leads 12 of semiconductor device 1. If the determined present position is not accurately aligned with a position to start forming leads 12, then recognition unit 6 produces and outputs a corrective command and corrective data to the controller for eliminating the positional error of semiconductor device 1. In response to the corrective command, the controller actuates the feeding and positioning mechanism of holder 2 based on the corrective data for eliminating the positional error of semiconductor device 1, thereby accurately positioning semiconductor device 1 in the lead-forming position, as shown in FIG. 2.

Then, the controller reads the registered data corresponding to the type number, supplied from an external source, of semiconductor device 1, and actuates Z-axis table assembly 4a, X-axis table assembly 4b, lead-fixing finger assembly 3a, and lead-forming finger assembly 3b to form leads 12 to predetermined shape based on the registered data.

Leads 12 are formed to shape as follows:

First, the fixed lower finger of lead-fixing finger assembly 3a bears the lower surfaces of the lead bases, or proximal lead ends, of leads 12 of semiconductor device 1 that has been positioned, and the movable upper finger of lead-fixing finger assembly 3b resiliently presses the upper surfaces of the lead bases under spring forces. Thereafter, the distal ends of leads 12 are gripped at a predetermined position thereon by the fixed and movable fingers of lead-forming finger assembly 3b. Leads 12 are now supported and gripped as shown in FIG. 3.

Figure 4:
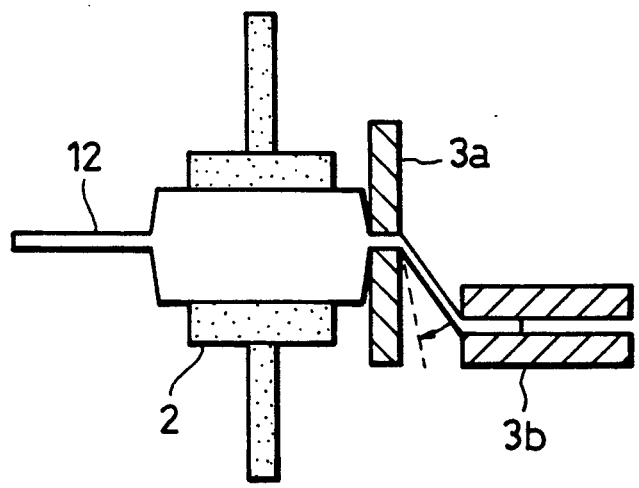
FIG. 4 is a cross-sectional view showing the manner in which the leads are bent along an arcuate path by the apparatus.

Then, while the distal ends of leads 12 are being gripped by lead-forming finger assembly 3b, Z-axis table assembly 4a is lowered and X-axis table assembly 4b is moved toward semiconductor device 1 thereby moving the distal ends of leads 12 arcuately about the lead bases held by lead-fixing finger assembly 3a. Lead-forming finger assembly 3b makes its arcuate movement as indicated by the arrow in FIG. 4 when Z-axis table assembly 4a and X-axis table assembly 4b are alternately moved by a small increment in the respective Z and X directions.

Figure 5:
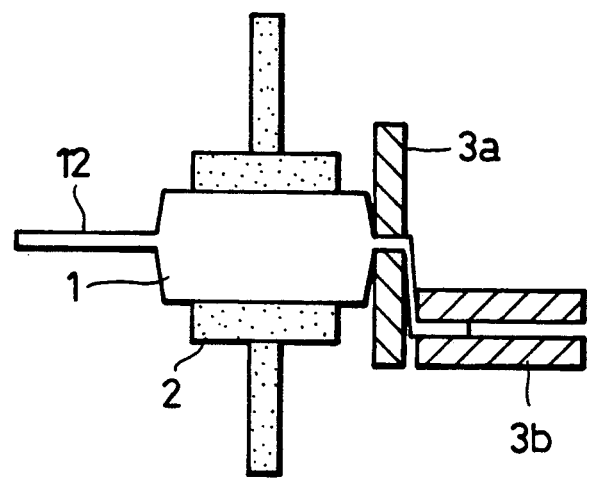
FIG. 5 is a cross-sectional view showing the leads formed to shape.

When lead-forming finger assembly 3b completes its arcuate movement, leads 12 on one side of semiconductor device 1 are fully formed to shape as shown in FIG. 5.

Lead-fixing finger assembly 3a and lead-forming finger assembly 3b are opened releasing formed leads 12, and the rotating mechanism of holder 2 is actuated to turn semiconductor device 1 through 180° about its own vertical central axis. Then, leads 12 on the other side of semiconductor device 1 are formed in the same manner as described above. Therefore, all of leads 12 of semiconductor device 1 of the SOP type can be formed to shape when the apparatus operates in two successive cycles.

Figure 6:
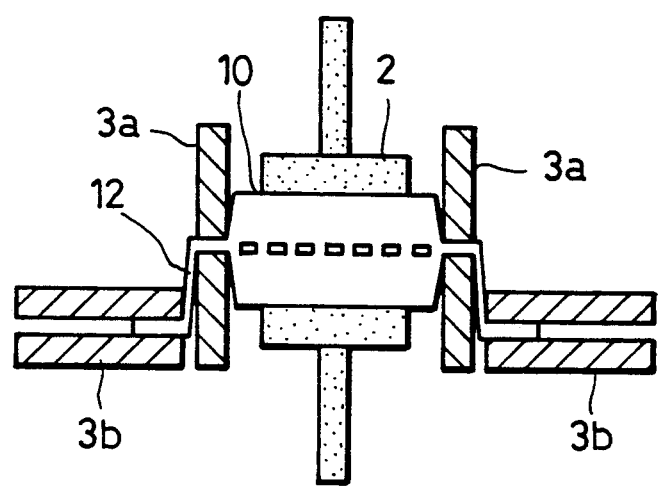
FIG. 6 is a cross-sectional view showing the manner in which the leads of a semiconductor device are formed to shape by an apparatus according to another embodiment of the present invention.

FIG. 6 shows an apparatus for forming leads of a semiconductor device according to another embodiment of the present invention. The apparatus shown in FIG. 6 is essentially a combination of the two apparatuses as shown in FIGS. 2 through 5. As shown in FIG. 6, the apparatus can simultaneously form leads 12 arrayed on both opposite sides of semiconductor device 10 of the QFP type to shape. After the two opposite arrays of leads 12 have been formed to shape, semiconductor device 10 is turned 90°, and then the other two opposite arrays of leads 12 are formed to shape. Since semiconductor device 10 of the QFP type has leads 12 arrayed on its four sides, all of leads 12 can be formed to shape when the apparatus operates in two successive cycles. Accordingly, the production rate of the apparatus shown in FIG. 6 is substantially twice that of the apparatus as shown in FIG. 2 through 5.

The apparatuses according to the illustrated embodiments are effective to form the leads of a semi-conductor device of the QFP or SOP type to shape. When the leads of a semiconductor device of a different type are to be formed to shape, stored parameters or registered data corresponding to that semiconductor device are selected and read by the controller, and Z-axis table assembly 4a, X-axis table assembly 4b, lead-fixing finger assembly 3a, and lead-forming finger assembly 3b are controlled based on the newly-read registered data to form the leads to desired shape.

As described above, rather than using dedicated die assemblies corresponding to different semiconductor types, the apparatuses using the present invention employ lead-fixing and -forming finger assemblies that are movable independently for forming the leads of semiconductor devices of different types based on respective stored data corresponding to different semiconductor device types. Therefore, it is not necessary to fabricate die assemblies to form the leads of new or different semiconductor devices. Switching from one semiconductor device type to another requires only about 10 second for changing registered data or parameters. Consequently, small quantities of semiconductor devices of many different types can be produced at a high production rate. Furthermore, the apparatuses can produce semiconductor devices of good quality since the lead-fixing and -forming finger assemblies do not scratch the leads.

Although certain preferred embodiments of the present invention have been shown and described in detail, it should be understood that various changes and modifications may be made therein without departing from the scope of the appended claims.

What is claimed is:

1. A method of forming an array of leads of a semiconductor device packaged on a lead frame and separated individually to a predetermined shape, comprising the steps of:
   (a) feeding a semiconductor device along a feed path into a lead-forming position;
   (b) holding the semiconductor device in said lead-forming position;
   (c) recognizing the actual position of distal ends of leads arrayed on one side of the semiconductor device;
   (d) correcting the positional error, if any, of said actual position with respect to the position to start forming the leads, thereby accurately positioning the semiconductor device in said lead-forming position;
   (e) holding lead bases of the leads with a lead-fixing finger assembly and distal end portions of the leads with a lead-forming finger assembly based on data corresponding to the type of the semiconductor device;
   (f) moving the distal end portions of the leads arcuately about the lead bases thereof with the lead-forming finger assembly thereby bending the leads to shape;
   (g) thereafter turning the semiconductor device about the central axis thereof in the lead-forming position to position the distal ends of leads arrayed on another side of the semiconductor device in the position to start forming the leads;
   (h) repeating steps (e) and (f) to bend the leads arrayed on the side of the semiconductor device to shape; and
   (i) repeating steps (g), (e), and (f) until the leads on all sides of the semiconductor device are bent to shape.

2. A method according to claim 1, wherein said step (c) of recognizing the actual position of distal ends of leads comprises the steps of producing image data of the distal ends of the leads and analyzing the produced image data.

3. A method according to claim 1, wherein said step (e) of holding lead bases of the leads with a lead-fixing finger assembly comprises the steps of holding the lead bases against a fixed finger with a moving finger, and resiliently urging the moving finger to press the lead bases against the fixed finger.

4. A method of forming opposite arrays of leads of a semiconductor device packaged on a lead frame and separated individually to a predetermined shape, comprising the steps of:
   (a) feeding a semiconductor device along a feed path into a lead-forming position;
   (b) holding the semiconductor device in said lead-forming position;
   (c) recognizing the actual position of distal ends of leads arrayed on a pair of opposite sides of the semiconductor device;
   (d) correcting the positional error, if any, of said actual position with respect to the position to start forming the leads, thereby accurately positioning the semiconductor device in said lead-forming position;
   (e) holding lead bases of the leads with a lead-fixing finger assembly and distal end portions of the leads with a lead-forming finger assembly based on data corresponding to the type of the semiconductor device;
   (f) moving the distal end portions of the leads arcuately about the lead bases thereof with the lead-forming finger assembly thereby bending the leads to shape;
   (g) thereafter turning the semiconductor device about the central axis thereof in the lead-forming position to position the distal ends of leads arrayed on another pair of opposite sides of the semiconductor device in the position to start forming the leads; and (h) repeating steps (e) and (f) to bend the leads arrayed on the other opposite sides of the semiconductor device to shape.

5. A method according to claim 4, wherein said step (c) of recognizing the actual position of distal ends of leads comprises the steps of producing image data of the distal ends of the leads and analyzing the produced image data.

6. A method according to claim 4, wherein said step (e) of holding lead bases of the leads with a lead-fixing finger assembly comprises the steps of holding the lead bases against a fixed finger with a moving finger, and resiliently urging the moving finger to press the lead bases against the fixed finger.

7. A method of forming an array of leads of a semiconductor device packaged on a lead frame and separated individually to a predetermined shape, comprising the steps of:

(a) feeding a semiconductor device into a lead-forming position and holding the semiconductor device in said lead-forming position;

(b) recognizing the actual position of leads of said semiconductor device and accurately positioning the semiconductor device in the lead-forming position:

(c) holding lead bases of the leads with a lead-fixing finger assembly and distal end portions of the leads with a lead-forming finger assembly;

(d) moving the distal end portions of the leads arcuately about the lead bases thereof with the lead-forming finger assembly thereby bending the leads to shape.

* * * * *